United States Patent [19]

Katsuragi et al.

[11] Patent Number: 5,062,128
[45] Date of Patent: Oct. 29, 1991

[54] TIMER CONTROL WITH SELECTABLE FREQUENCY DIVIDER

[75] Inventors: Koji Katsuragi; Yoshiaki Yanagida, both of Hirakata; Soichi Matsuyama, Kyoto; Yoshihisa Ikuta, Toyonaka, all of Japan

[73] Assignee: Mita Industrial Co., Ltd., Osaka, Japan

[21] Appl. No.: 503,777

[22] Filed: Mar. 27, 1990

[30] Foreign Application Priority Data

Mar. 29, 1989 [JP] Japan .................................. 1-79188

[51] Int. Cl.$^5$ ...................... G06M 3/02; G06M 3/06
[52] U.S. Cl. ........................................ 377/55; 377/2; 377/16; 377/56; 377/20; 204/DIG. 11
[58] Field of Search ...................... 377/16, 47, 55, 56, 377/20, 2; 328/129.1; 204/DIG. 11

[56] References Cited

U.S. PATENT DOCUMENTS

| 3,878,370 | 4/1975 | Santomango et al. | 377/20 |
| 4,066,875 | 1/1978 | Ollington et al. | 377/47 |
| 4,079,315 | 3/1978 | Mohr | 377/20 |
| 4,251,999 | 2/1981 | Tanaka | 377/56 |

FOREIGN PATENT DOCUMENTS 1472792  5/1977  United Kingdom .

Primary Examiner—John S. Heyman
Attorney, Agent, or Firm—Antonelli, Terry, Stout & Kraus

[57] ABSTRACT

A semiconductor integrated circuit constructed on a single chip. Either one of a signal inputted to a clock signal input terminal and a signal obtained by dividing the frequency of the clock signal inputted to the clock signal input terminal is selected by a selecting circuit responsive to a selection signal supplied from the exterior of the chip to be supplied to a control circuit. Consequently, the frequency dividing circuit can be bypassed in response to the selecting circuit. Accordingly, it is possible to easily provide operation at a high frequency exceeding the maximum operating frequency of component devices forming the semiconductor integrated circuit. This can be done by connecting an external circuit having the same function as that of the circuit bypassed and capable of higher-speed operation.

8 Claims, 4 Drawing Sheets

TIMER CONTROL WITH SELECTABLE FREQUENCY DIVIDER

BACKGROUND OF THE INVENTION

The present invention relates generally as a semiconductor integrated circuit constructed to a single chip, and more particularly, to a semiconductor integrated circuit constructed as a gate array or the like for use for various specific applications.

JP-A-72154/1987 describes the prior art associated with the present invention. The above document describes that (a) a control portion in a conventional laser beam printer could not be made small in size or weight because control circuits for an interface control portion and a mechanism control portion were respectively constituted by approximately 40 general-purpose discrete ICs, and proposes (b) techniques for making the laser beam printer small in size and weight by forming each of the control circuits, which were respectively made as general-purpose discrete ICs, into a one-chip semiconductor integrated circuit.

The adoption of this proposal allows the control portion in the laser beam printer to be reliably miniaturized. However, the prior art has a disadvantage in that the operating speed of logic circuits formed into a one-chip semiconductor integrated circuit is determined by characteristics of semiconductor materials and devices (generically referred to as "component devices" hereinafter) forming the semiconductor integrated circuit. More specifically, the maximum operating frequency inherent in the component devices is determined by the characteristics thereof. Accordingly, the operating frequency of the control circuit formed as a one-chip semiconductor integrated circuit is restricted by the maximum operating frequency of the characteristics of the component devices.

Meanwhile, in a laser beam printer or the like, studies for improving the resolution of these shortcomings have been conducted day after day. Consequently, printers superior in resolution have been commercialized. For example, at the present time, a laser beam printer capable of outputting 12 to 16 lines per 1 mm is commercially available. In such a laser beam printer, the control portion must output a control signal for drawing 12 to 16 times per 1 mm. Thus, high-speed operation of the control portion is required as the resolution of the laser beam printer is improved. When a high-speed operation of this control portion is achieved, it is necessary to count signals having a high frequency to define a horizontal position where dots are to be drawn, for example, in a control circuit for controlling operation of a laser diode.

Furthermore, if the number of sheets of paper to be printed per unit time by the laser beam printer is increased, the operating speed of each of control circuits constituting the control portion must be increased.

If a lot of general-purpose discrete ICs are formed into a one-chip semiconductor integrated circuit by adopting the above described proposal (b), however, there occurs the following problem: If a higher operating frequency than the maximum operating frequency determined by the characteristics of the component devices forming the semiconductor integrated circuit is required by the improvement in resolution of the printer, a semiconductor integrated circuit capable of dealing with a higher-speed operation must be newly produced by another semiconductor process. More specifically, in a case where an integrated circuit is formed of component devices having the maximum operating frequency required in the present stage, and the resolution of the printer is to be improved in the near future, a higher operating frequency than the maximum operating frequency of the component devices is required, and a semiconductor integrated circuit must be newly produced again.

On the other hand, it has been suggested to construct an integrated circuit using component devices having a maximum operating frequency higher than the operating frequency required in the present stage in view of the above described possible improvement in resolution of the printer. However, that is not desirable, because it costs a lot for matters which are not required in the present stage and may not necessarily be required in the near future, thereby leading to an increased cost for the semiconductor integrated circuit.

Similar technical subject is common to a semiconductor integrated circuit for a laser beam printer and various semiconductor integrated circuits for specific applications; that is, semiconductor integrated circuit referred to as ASICs (Application Specific Integrated Circuits).

SUMMARY OF THE INVENTION

An object of the present invention is to provide a one-chip semiconductor integrated circuit which can easily cope with the case where a higher-speed operation is desired for the future.

In a semiconductor integrated circuit constructed as a single chip and having a clock signal input terminal, a frequency dividing circuit for dividing the frequency of a clock signal inputted from the clock signal input terminal, and a control circuit for obtaining a predetermined output for driving or controlling an external unit on the basis of the signal obtained by dividing the frequency of the clock signal, the present invention has been made to solve the above described problems by providing, in this semiconductor integrated circuit, a selecting circuit for selecting a state where the clock signal inputted from the clock signal input terminal is supplied to the control circuit through the frequency dividing circuit or a state where the clock signal inputted from the clock signal input terminal is directly supplied to the control circuit rather than through the frequency dividing circuit.

When the frequency of the clock signal inputted from the clock signal input terminal is higher than the maximum operating frequency determined by characteristics of component devices of a chip, the frequency dividing circuit inside of the semiconductor integrated circuit cannot divide the frequency of the clock signal. Consequently, even if the frequency of a signal obtained by dividing the frequency of the clock signal is not more than the maximum operating frequency of the component devices where circuit portions other than the frequency dividing circuit could be used, the entire chip cannot be used, and a new chip formed of new semiconductor materials replaces the former one. In such a case, however, the other circuit portions can be used as before, if the frequency dividing circuit can be replaced with another frequency dividing circuit capable of the high-speed operation.

According to the present invention, the selecting circuit can select a state where the frequency dividing circuit provided inside of the semiconductor integrated circuit is utilized or a state where it is not utilized. When needing a circuit capable of performing an operation with a clock signal having a higher frequency than the maximum operating frequency of the component devices of the chip and having the same function as that of the semiconductor integrated circuit, the selecting circuit is operated. Consequently, the frequency dividing circuit inside of the semiconductor integrated circuit is bypassed. In this state, a required function can be achieved if another frequency dividing circuit capable of operating at a high speed is provided outside of the semiconductor integrated circuit. More specifically, the frequency of a clock signal having a high frequency may be divided by the external frequency dividing circuit, and the signal obtained thereby may be inputted to the clock signal input terminal of the semiconductor integrated circuit.

As described in the foregoing, in the semiconductor integrated circuit according to the present invention, it is possible to easily cope with a case where operation with a clock signal having a frequency exceeding the maximum operating frequency inherent to the component devices is required, by not using the frequency dividing circuit provided inside of the semiconductor integrated circuit but using an external frequency dividing circuit connected to the clock signal input terminal. More specifically, a new semiconductor integrated circuit using component devices which can operate with the high-frequency clock signal need not be produced. As a result, the cost of, for example, the control portion in a laser beam printer can be reduced.

The foregoing features of the present invention will become apparent from the following description when taken in conjunction with the accompanying drawings.

DESCRIPTION OF THE PREFERRED EMBODIMENTS

Figure 1:
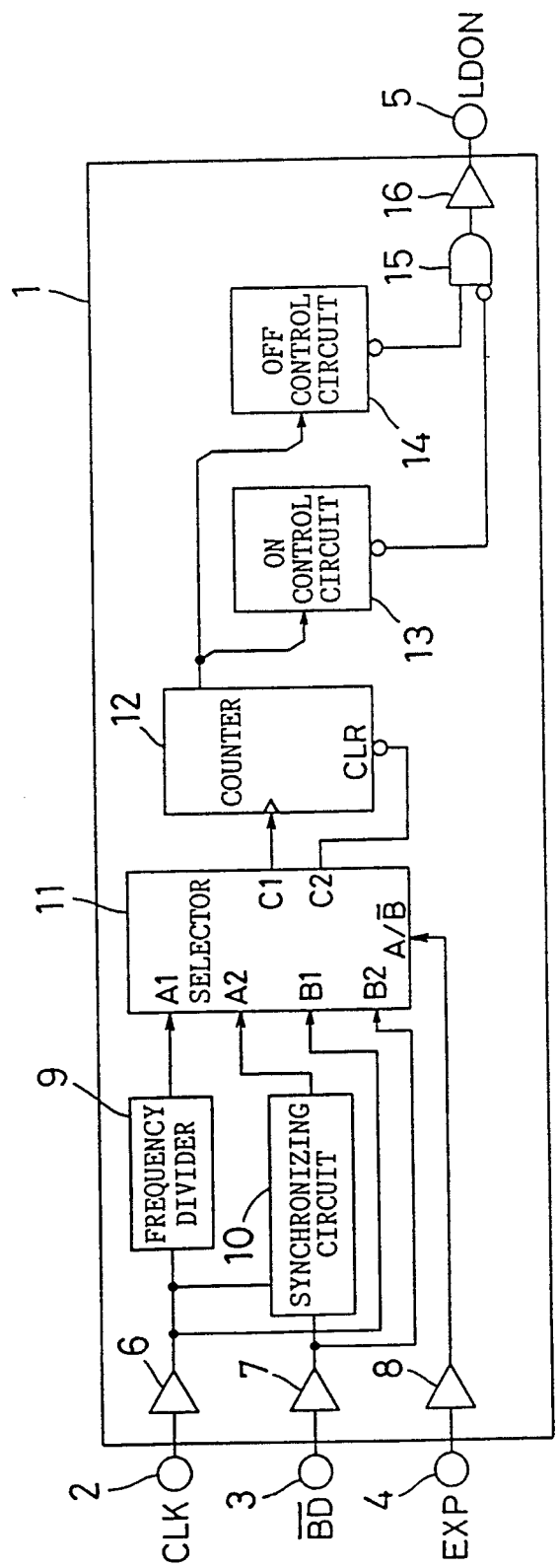
FIG. 1 is a block diagram showing the construction of a semiconductor integrated circuit for a laser beam printer according to an embodiment of the present invention.

FIG. 1 is a block diagram showing the construction of a semiconductor integrated circuit for a laser beam printer according to an embodiment of the present invention. A semiconductor integrated circuit 1 for a laser beam printer constructed as a one-chip comprises a clock signal input terminal 2 to which a clock signal is inputted, a horizontal synchronizing signal input terminal 3 to which a horizontal synchronizing signal is inputted, a switching signal input terminal 4 to which a switching signal is inputted, and an output terminal 5 for providing a driving output to be supplied to a laser diode (not shown). In addition, input buffers 6, 7 and 8 provided corresponding to the respective input terminals 2, 3 and 4, a frequency divider 9, a synchronizing circuit 10, a selector 11, a counter 12 of, for example, 14 bits, an ON control circuit 14 for a laser diode, and an OFF control circuit 14 for a laser diode, an AND gate 15 and an output buffer 16 are provided inside of the semiconductor integrated circuit 1.

The clock signal inputted from the clock signal input terminal 2 is generally supplied to a terminal A1 of the selector 11 through the input buffer 6 after the frequency thereof is divided by the frequency divider 9. In addition, the horizontal synchronizing signal inputted from the horizontal synchronizing signal input terminal 3 is generally supplied to a terminal A2 of the selector 11 through the input buffer 7 after it is synchronized with the clock signal by the synchronizing circuit 10. Outputs of the input buffers 6 and 7 are also supplied to terminals B1 and B2 of the selector 11 directly, that is, without passing through the frequency divider 9 or the synchronizing circuit 10.

The selector 11 is a circuit for selecting a signal depending on the state of the signal supplied to the switching signal input terminal 4, that is, depending on whether the signal supplied to the input terminal 4 is at a high level or a low level. In general, a high level signal is supplied to the switching signal input terminal 4. In this case, the selector 11 outputs the signals supplied to the terminals A1 and A2 from terminals C1 and C2 to the counter 12.

On the other hand, when the signal supplied to the switching signal input terminal 4 is at a low level, the selector 11 outputs the signals supplied to the terminals B1 and B2 from the terminals C1 and C2 to the counter 12.

The counter 12, which is of 14 bits as described above in the present embodiment, counts clock signals supplied from the terminal C1 of the selector 11 or signals obtained by dividing the frequencies thereof while being cleared by the horizontal synchronizing signal supplied from the terminal C2 of the selector 11. Thus, the counter 12 counts the clock signals for each horizontal scanning line, to calculate a position where dots are to be drawn on the horizontal scanning line. An output of the counter 12 is supplied to the ON control circuit 13 and the OFF control circuit 14 for a laser diode. Output signals of the control circuits 13 and 14 are supplied to the AND gate 15, to obtain the logical product thereof. A driving output for turning the laser diode on only in a required period is provided from the output terminal 5 on the basis of the output of the AND gate 15.

The present embodiment is characterized in that the selector 11 can select either a state where the clock signal and the horizontal synchronizing signal are respectively supplied to the counter 12 through the frequency divider 9 and the synchronizing circuit 10, or a state where they are directly supplied to the counter 12, bypassing the frequency divider 9 and the synchronizing circuit 10. Consequently, the present embodiment has the advantage that a circuit having the same function as that of the semiconductor integrated circuit 1 and capable of performing a high-speed operation can be achieved provided that the frequency divider 9 and the synchronizing circuit 10 which are provided inside of the semiconductor integrated circuit 1 are not used but another frequency divider and synchronizing circuit capable of performing a high-speed operation which are provided outside thereof are used to supply their outputs to the counter 12 through the selector 11.

Figure 2:
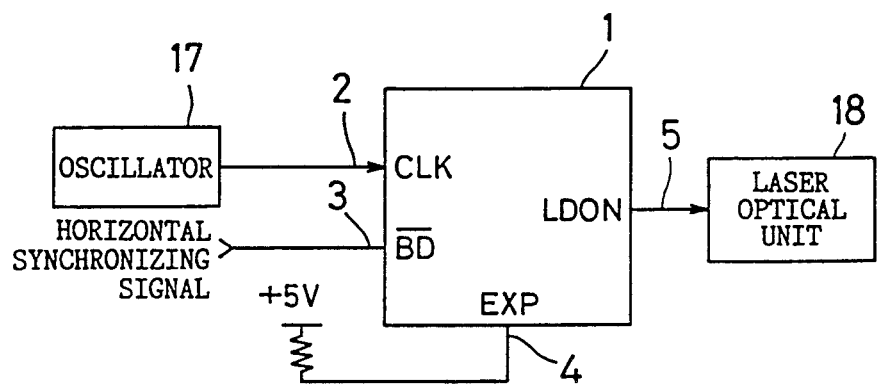
FIGS. 2 and 3 are block diagrams showing an example of the use of the semiconductor integrated circuit shown in FIG. 1.
Figure 3:
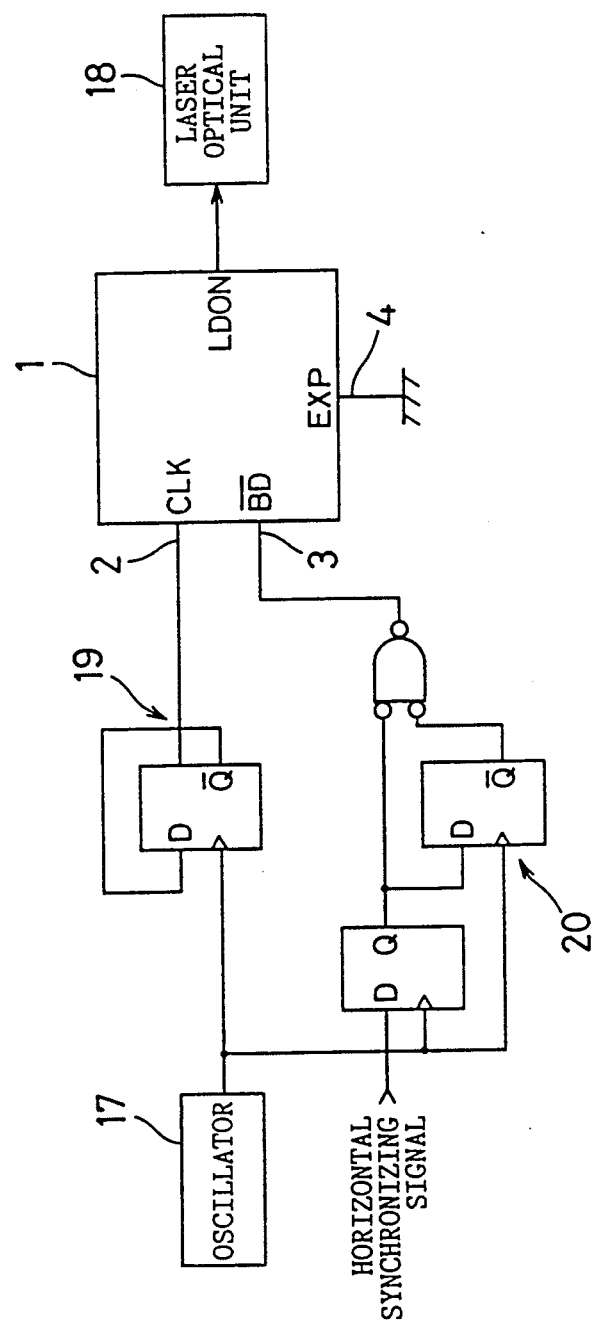

FIGS. 2 and 3 are block diagrams showing an example of the use of the semiconductor integrated circuit 1 for a laser beam printer described with reference to FIG. 1. This semiconductor integrated circuit 1 is connected to other circuit elements as shown in FIG. 2 under normal usage. A clock signal outputted from an oscillator 17 is supplied to clock signal input terminal 2, and a horizontal synchronizing signal is supplied to horizontal synchronizing signal input terminal 3. In addition, the state of switching signal input terminal 4 is kept at a high level. As described above, if the state of the switching signal input terminal 4 is kept at a high level, selector 11 selects outputs of frequency divider 9 and synchronizing circuit 10 provided inside of the semiconductor integrated circuit 1. A driving output provided by output terminal 5 is supplied to a laser optical unit 18.

If a circuit having the same function as that of the semiconductor integrated circuit 1 and capable of performing an operation at a frequency exceeding the maximum operating frequency determined by characteristics of component devices of the chip is required, this semiconductor integrated circuit 1 is connected to other circuit components as shown in FIG. 3. More specifically, the switching signal input terminal 4 is kept at a low level. As a result, the frequency divider 9 and the synchronizing circuit 10 provided inside the semiconductor integrated circuit 1 are not utilized, but are bypassed. The output of the oscillator 17 is supplied to the clock signal input terminal 2 through a frequency divider 19 provided outside of the semiconductor integrated circuit 1 and capable of high-speed operation. The horizontal synchronizing signal is supplied to the horizontal synchronizing signal input terminal 3 through a synchronizing circuit 20 provided outside the semiconductor integrated circuit 1 and capable of high-speed operation.

In this construction shown in FIG. 3, the frequency divider 9 contained in the semiconductor integrated circuit 1 is not used. Instead, the frequency of the clock signal having a high frequency from the oscillator 17 is divided by the frequency divider 19 provided outside the semiconductor integrated circuit 1. Consequently, even if the frequency of the clock signal from oscillator 17 is too high to be divided by the frequency divider 9, no problem occurs. More specifically, even if the frequency of the clock signal from the oscillator 17 is higher than the maximum operating frequency of the component devices of the chip, the desired function can be achieved by the frequency divider 19 and counter 12 and control circuits 13 and 14 inside the semiconductor integrated circuit 1. However, the signal outputted from the frequency divider 19 is supplied to the counter 12 through the selector 11 without any modification (that is, without dividing the frequency thereof). Accordingly, it goes without saying that the signal outputted from the frequency divider 19 must be a signal having a frequency of not more than the maximum operating frequency of the component devices of the chip. In addition, the counter 12 and the control circuits 13 and 14 are generally constructed on the assumption that the frequency dividing ratio the frequency divider 9 is fixed. Consequently, if a signal obtained by further dividing by the frequency divider 9 the frequency of the signal outputted from the frequency divider 19 is supplied to the counter 12, faulty operation naturally occurs. More specifically, even if the signal outputted from the frequency divider 19 is a signal having a frequency of not more than the maximum operating frequency of the component devices of the chip, further frequency division of this output signal by the frequency divider 9 is not allowed.

The frequency divider 19 and the synchronizing circuit 20 added outside of the semiconductor integrated circuit 1 can be achieved by general-purpose ICs capable of high-speed operation such as TTLs (transistor transistor logic devices). As this general-purpose IC, a relatively low-cost one can be used.

In the above described manner, a circuit having the same function as that of the semiconductor integrated circuit 1 and capable of higher-speed operation can be constructed by adding several low-cost general-purpose ICs to the semiconductor integrated circuit 1.

More specifically, it is assumed that the semiconductor integrated circuit 1 is, for example, a gate array fabricated in a CMOS process, and the maximum operating frequency thereof is, for example, 30 MHz. In addition, it is assumed that the frequency divider 9 contained in the semiconductor integrated circuit 1 decreases the frequency of an input signal by one-half. In this case, if a circuit which operates at a frequency of 60 MHz and has the same function as that of the semiconductor integrated circuit 1 is required, the frequency divider 19 and the synchronizing circuit 20 which operate at this frequency may be connected to the semiconductor integrated circuit 1, as shown in FIG. 3. As the frequency divider 19, however, one for decreasing the frequency of the input signal by one-half must be used. The frequency divider 19 and the synchronizing circuit 20 can be formed of low-cost general-purpose ICs such as TTLs which can operate at 60 MHz.

Figure 4:
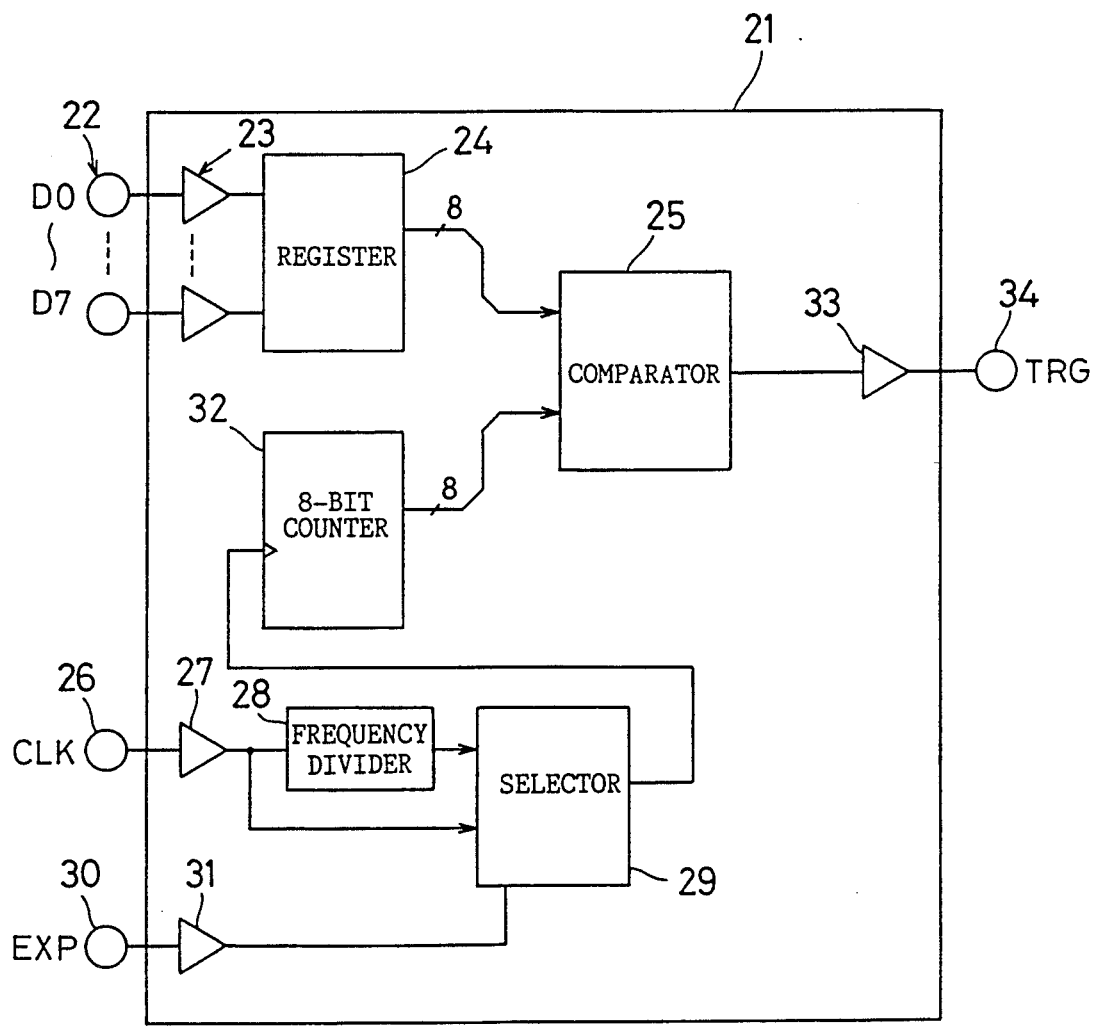
FIG. 4 is a block diagram showing the construction of a semiconductor integrated circuit which functions as a time counter according to another embodiment of the present invention.

FIG. 4 is a block diagram showing the construction of a semiconductor integrated circuit 21 according to another embodiment of the present invention. This semiconductor integrated circuit 21 functions as a time counter.

Description is made with reference to FIG. 4. A data input terminal 22 has eight pins D0 to D7. Particular data is supplied to this data input terminal 22 from, for example, a CPU (not shown). The data supplied to the data input terminal 22 is stored in a register 24 through input buffers 23 provided corresponding to the respective input pins D0-D7. 8-bit data held in the register 24 is supplied to a comparator 25.

A clock signal inputted from a clock signal input terminal 26 is supplied to a selector 29 through an input buffer 27 after the frequency thereof is divided by a frequency divider 28. A clock signal which bypasses the frequency divider 28 is also supplied to the selector 29.

The selector 29, which is a circuit switched depending on whether the state of a switching signal, supplied from a switching signal input terminal 30 through an input buffer 31, is at a high level or a low level, selects the clock signal whose frequency is divided by the frequency divider 28 or the clock signal, whose frequency is not divided, which bypasses the frequency divider 28, to output the same.

In the present embodiment, the selector 29 can select a state where the frequency divider 28 provided inside of semiconductor integrated circuit 21 can be utilized or a state where it cannot be utilized, as in the embodiment shown in FIG. 1. Consequently, if high-speed operation is required, the frequency divider 28 contained in the semiconductor integrated circuit 21 is not used. Alternatively, an external frequency divider (not shown) capable of high-speed operation is connected to the semiconductor integrated circuit 21. If a signal generated by dividing the frequency of high-frequency signal by the external frequency divider is supplied to the clock signal input terminal 26, a circuit is constructed which can perform high-speed operation by the semiconductor integrated circuit 21 and the external frequency divider and achieves the same function as that of the semiconductor integrated circuit 21.

Output signals of the selector 29 are supplied to a 8-bit counter 32, to be counted. An output of the counter 32 is supplied to the comparator 25, to be compared with the output of the register 24. If the outputs coincide comparator 25 provides a detection output. This detection output is provided to a trigger signal output terminal 34 through an output buffer 33.

Although description was made taking as examples a semiconductor integrated circuit constituting a control circuit of a laser beam printer and a semiconductor integrated circuit constituting a time counter, it goes without saying that a semiconductor integrated circuit constituting another circuit for specific applications may be used. It should be understood that various modifications may be made without departing from the scope of the present invention.

What is claimed is:

1. A semiconductor integrated circuit for providing a drive signal output, said circuit comprising:
   a first input terminal for receiving an inputted clock signal;
   a frequency dividing circuit connected to said first input terminal for dividing the frequency of the inputted clock signal to provide a frequency-divided clock signal;
   a second input terminal for receiving an inputted horizontal synchronizing signal;
   a synchronizing circuit connected to said first and second input terminals for synchronizing the inputted clock signal and the inputted horizontal synchronizing signal to provide a clock-synchronized horizontal synchronizing signal;
   a selector circuit having (a) a first clock signal input connected to said frequency divider circuit for receipt of the frequency divided clock signal therefrom, (b) a first synchronizing signal input connected to said synchronizing circuit for receipt of the clock-synchronized horizontal synchronizing signal therefrom, (c) a second clock signal input connected to said first input terminal for receipt of the inputted clock signal therefrom, (d) a second synchronizing signal input connected to said second input terminal for receipt of the inputted horizontal synchronizing signal therefrom, (e) a clock signal output, and (f) a synchronizing signal output, said selector circuit in a first condition connecting said first clock signal input to said clock signal output, to provide as an output therefrom the frequency divided clock signal, and connecting said first synchronizing signal input to said synchronizing signal output, to provide as an output therefrom the clock-synchronized horizontal synchronizing signal, and in a second condition connecting said second clock signal input to said clock signal output, to provide as an output therefrom the inputted clock signal, and connecting said second synchronizing signal input to said synchronizing signal output, to provide as an output therefrom the inputted horizontal synchronizing signal; and
   a counter circuit having a count input connected to said selector circuit clock signal output for counting clock signals received therefrom, a clear input connected to said selector circuit synchronizing signal output for clearing the count of said counter circuit in response to the selector circuit synchronizing output, and an output for providing a count output; and
   an output control circuit connected to said counter circuit output for providing a control output signal on the basis of the count output,
   whereby in the selector circuit first condition the control output signal is based on the frequency divided clock signal and the clock-synchronized horizontal synchronizing signal, and in the selector circuit second condition the control output signal is based on the inputted clock signal and the inputted horizontal synchronizing signal.

2. A semiconductor integrated circuit as claimed in claim 1, further comprising a third input terminal for receiving an inputted selection signal, and wherein said selector circuit has a control input connected to said third input terminal for receipt of the inputted selection signal therefrom, and said selector circuit is responsive to the presence of the inputted selection signal to assume the first condition and is responsive to the absence of the inputted selection signal to assume the second condition.

3. A semiconductor integrated circuit as claimed in claim 2, wherein said selector circuit is responsive to a high voltage level as the presence of the inputted selection signal and is responsive to a low voltage level as the absence of the inputted selection signal.

4. A semiconductor integrated circuit as claimed in claim 2, wherein said frequency divider circuit, said synchronizing circuit, said selector circuit, said counter circuit, and said output control circuit are constructed as a single integrated circuit chip with said first, second, and third input terminals providing inputs thereto.

5. A semiconductor integrated circuit as claimed in claim 4, wherein said output control circuit is a laser diode control circuit for driving a laser diode of a laser beam printer.

6. A semiconductor integrated circuit as claimed in claim 1, wherein said output control circuit is a laser diode control circuit for driving a laser diode of a laser beam printer.

7. A semiconductor integrated circuit as claimed in claim 1, wherein said frequency divider circuit, said synchronizing circuit, said selector circuit, said counter circuit, and said output control circuit are constructed as a single integrated circuit chip with said first and second input terminals providing inputs thereto.

8. A semiconductor integrated circuit as claimed in claim 7, wherein said output control circuit is a laser diode control circuit for driving a laser diode of a laser beam printer.

* * * * *